(12) United States Patent
Duval et al.

(10) Patent No.: US 6,788,607 B2
(45) Date of Patent: Sep. 7, 2004

(54) METHOD OF PROGRAMMING MEMORY CELLS BY BREAKING DOWN ANTIFUSE ELEMENTS

(75) Inventors: Benjamin Duval, Saint Maximin (FR); Fabrice Marinet, Chateauneuf le Rouge (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 10/406,632

(22) Filed: Apr. 3, 2003

(65) Prior Publication Data

US 2003/0218924 A1 Nov. 27, 2003

(30) Foreign Application Priority Data

Apr. 4, 2002 (FR) .......................................... 02 04184

(51) Int. Cl.[7] .................................................. G11C 7/00
(52) U.S. Cl. .................. 365/225.7; 365/96; 365/189.07
(58) Field of Search .............................. 365/225.7, 96, 365/189.07, 189.12, 240

(56) References Cited

U.S. PATENT DOCUMENTS

| | | | |
|---|---|---|---|
| 5,497,475 A | 3/1996 | Alapat | 395/430 |
| 5,684,732 A | 11/1997 | Sako | 365/96 |
| 5,838,625 A | * 11/1998 | Cutter et al. | 365/225.7 |
| 6,055,173 A | 4/2000 | Mullarkey et al. | 365/96 |
| 6,229,733 B1 | 5/2001 | Male | 365/185.18 |
| 2002/0136076 A1 | 9/2002 | Kleveland et al. | 365/225.7 |

FOREIGN PATENT DOCUMENTS

WO 02/078003 10/2002 ............. G11C/7/00

* cited by examiner

*Primary Examiner*—David Lam
(74) *Attorney, Agent, or Firm*—Lisa K. Jorgenson; Allen, Dyer, Doppelt, Milbrath & Gilchrist, P.A.

(57) ABSTRACT

A method of programming a row of antifuse memory cells includes breaking down at least N antifuse elements in the memory cells. The breakdown includes the application of a breakdown voltage to the anode of each antifuse element. The antifuse elements are broken down sequentially by groups of P antifuse elements, with P being less than N and at least equal to 1. The antifuse elements of a same group simultaneously receive the breakdown voltage. The breakdown of a next group of antifuse elements immediately takes place after the breakdown of a previous group of antifuse elements.

26 Claims, 5 Drawing Sheets

METHOD OF PROGRAMMING MEMORY CELLS BY BREAKING DOWN ANTIFUSE ELEMENTS

FIELD OF THE INVENTION

The present invention relates to a method of programming a row of antifuse memory cells by breaking down at least N antifuse elements in the memory cells, with the breakdown comprising application of a breakdown voltage to an anode of each antifuse element.

BACKGROUND OF THE INVENTION

The use of antifuse memory cells in integrated circuits allows a low cost realization of non-volatile memory areas having an average but sufficient storing capacity for recording a small amount of permanent data, such as an integrated circuit serial number, a secret code, parameter data of the integrated circuit's analog variables, etc. In a general way, memories of the fuse or antifuse type are an advantageous alternative to non-volatile memories based on the principle of electrical charge retention, using for example, floating gate transistors.

A memory cell of the fuse type comprises a fuse element, for example, a fuse made of polysilicon. This is initially conductive and becomes non-conductive when it is broken down. The breakdown is caused by a laser or is obtained by application of a breakdown voltage. On the contrary, an antifuse memory cell comprises an antifuse element, generally an oxide layer, which is initially insulated and becomes conductive after breakdown. The breakdown causes a conductive path to appear in the oxide.

Between these two technologies (fuse or antifuse), the antifuse is at present the best approach in terms of integration density and flexibility. However, antifuse memories have a rather long programming time, which is a major drawback in some applications, such as in a large scale production of integrated circuits each comprising an antifuse memory area to be programmed, for example. To aid in better understanding, the collective breakdown of 20 antifuse elements requires the application of a breakdown voltage during a time of about 50 ms. This time is not negligible in the field of microelectronics, where programming times generally are on the order of some tens of milliseconds or some milliseconds rather than several tens of milliseconds.

As a reminder, FIG. 1 illustrates the conventional arrangement of N antifuse elements $AF_1$, $AF_2$ ... $AF_N$ during their breakdown. The antifuse elements are shown like capacitors and the insulating material between the electrodes of the capacitors forms the antifuse element. The cathodes of the antifuse elements are coupled to ground and the anodes are coupled to a common node N1. Node N1 is coupled to a source of voltage Vhv by a switch SWg. The switch SWg is closed during a predetermined time t(N), during which the antifuse elements receive the breakdown voltage Vhv on their anodes. The breakdown of the antifuse material causes a serial resistance Rc between the electrodes which renders the antifuse element conductive.

These antifuse elements are arranged in a row of memory cells comprising selection, access and read circuitry which are not shown here for the sake of simplicity. The programming of the row of memory cells corresponds to the breakdown of the antifuse elements. FIG. 2 is a graph showing the breakdown time t(N) versus the number N of antifuse elements which are collectively broken down. It appears that time t(N) is not constant and depends on the number N. More particularly, this graph is not linear and tends to increase in a pseudo-exponential way with number N.

SUMMARY OF THE INVENTION

In view of the foregoing background, an object of the present invention is to reduce the breakdown time of a group of N antifuse elements.

In particular, the present invention aims at solving the problem by rapidly increasing the breakdown time in relation to the number N of antifuse elements to be broken down. In a general way, the present invention provides a method of programming antifuse memory cells for decreasing the breakdown time of a group of N antifuse elements.

To achieve this object, the present invention provides a method of programming a row of parallel antifuse memory cells comprising a step of breaking down at least N antifuse elements in the memory cells, with the breakdown of an antifuse element comprising the application of a breakdown voltage to the anode of each antifuse element. The antifuse elements are sequentially broken down by groups of P antifuse elements, with P being less than N and at least equal to 1. The antifuse elements of a same group simultaneously receive the breakdown voltage. The breakdown of a next group of antifuse elements immediately takes place after the breakdown of a previous group of antifuse elements.

According to one embodiment, P is equal to 1, and the antifuse elements are individually broken down one after the other. According to another embodiment, P is chosen among several possible values so that the total breakdown time of the N antifuse elements is optimal. According to yet another embodiment, the number P of simultaneously broken down antifuse elements is not constant during the programming of the row of memory cells.

The method preferably further comprises detecting the breakdown of the antifuse elements. According to one embodiment, P next antifuse elements are not broken down as long as the breakdown of P previous antifuse elements has not been detected. The breakdown of an antifuse element may be detected when a voltage greater than a predetermined threshold appears on the cathode of the antifuse element while its anode receives the breakdown voltage.

The method may be applied to a memory comprising rows of cells arranged in word lines and bit lines, and the programming of a row of cells comprises the selection of a word line and the sequential application of the breakdown voltage to the bit lines, by groups of P bit lines receiving the breakdown voltage simultaneously.

The method may also be applied to a row of antifuse memory cells having a differential architecture, with each memory cell comprising two antifuse elements. The programming of each cell comprises the breakdown of an antifuse element chosen among the two antifuse elements of the cell according to the value of a binary data to be programmed. The breakdown of the row of cells comprises the sequential breakdown of only one antifuse element in each cell of the row.

The present invention also relates to an antifuse integrated circuit memory comprising at least one row of parallel antifuse memory cells. The memory cells are programmable by breaking down N antifuse elements in the memory cells. The memory preferably comprises means for programming the row of cells by application of a breakdown voltage to an anode of each antifuse element to be broken down. The means for programming comprise means for sequentially applying the breakdown voltage to groups of P antifuse elements, with P being less than N and at least equal to 1. The antifuse elements of a same group simultaneously receive the breakdown voltage. The breakdown of a next group of antifuse elements immediately takes place after the breakdown of a previous group of antifuse elements.

According to one embodiment, P is equal to 1 and the means for programming apply the breakdown voltage individually to the antifuse elements so that the antifuse elements are broken down one after the other. According to another embodiment, the number P of antifuse elements in the groups of simultaneously broken down antifuse elements is not constant during the programming of a row of memory cells.

The memory further comprises means for detecting the breakdown of antifuse elements, and delivering a breakdown detection signal. The means for programming are arranged so that the breakdown voltage is not to be applied to a next group of antifuse elements as long as the breakdown of a previous group has not been detected.

The detection means may comprise at least one comparator having a first input coupled to the cathode of at least one antifuse element, a second input receiving a reference voltage and an output delivering the breakdown detection signal.

The memory may also comprise a sequential circuit and switches driven by the sequential circuit for sequentially applying the breakdown voltage to the antifuse elements. The sequential circuit receives the breakdown detection signal.

The memory may comprise several rows of cells arranged in word lines and bit lines, with each bit line comprising a distribution line for the breakdown voltage. The means for programming are arranged to select a word line and apply the breakdown voltage sequentially to the distribution lines of the bit lines, by groups of P bit lines receiving the breakdown voltage simultaneously.

The memory may also comprise memory cells having a differential architecture, and each comprises two parallel antifuse elements, and switches for selecting an antifuse element to be broken down among the two according to the value of a binary data to be recorded.

BRIEF DESCRIPTION OF THE DRAWINGS

These objects, characteristics and advantages as well as others of the present invention will be described with more details in the following description of the method of the invention and an embodiment of an antifuse memory according to the invention, given in a non-limiting way in conjunction with the accompanying drawings, in which.

DETAILED DESCRIPTION OF THE PREFERRED EMBODIMENTS

Figure 1:
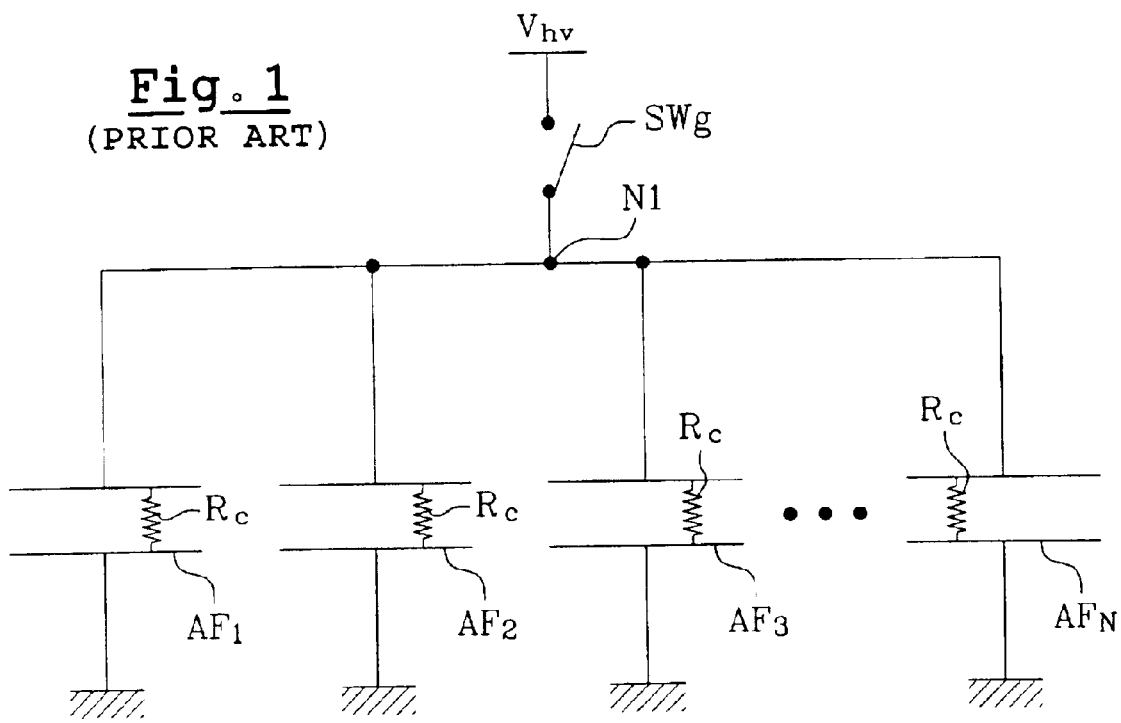
FIG. 1 illustrates a method of breaking down a row of antifuse elements according to the prior art.
Figure 2:
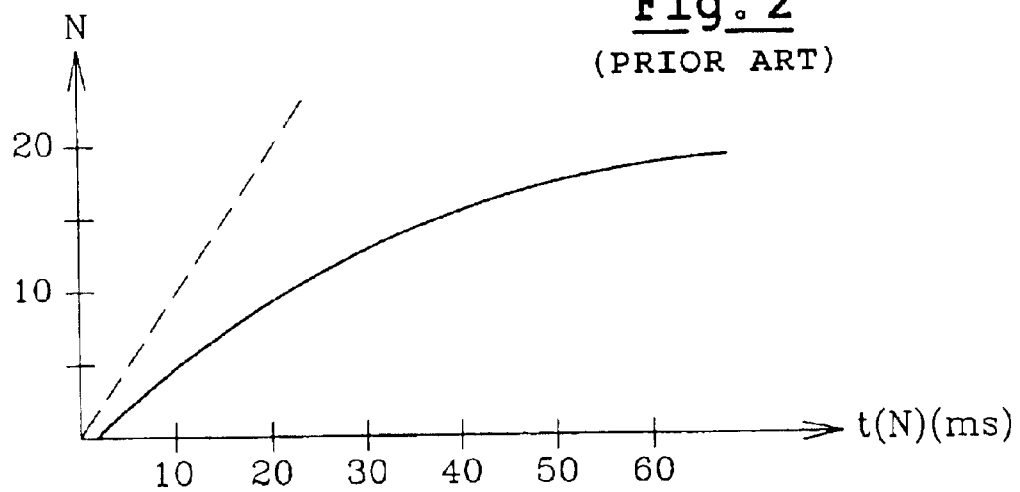
FIG. 2 is a graph representing the collective breakdown time of antifuse elements versus the number of antifuse elements according to the prior art.

A first aspect of the method according to the present invention will now be discussed. According to observations and hypothesis in accordance with the present invention, the non-linear relation existing between the breakdown time t(N) and the number N of antifuse elements to be collectively broken down is due to the fact that the breakdown time of an antifuse element, considered individually, depends on the intensity of the current available for breakdown. The breakdown time is longer when this current is low. However, when a breakdown voltage Vhv is applied to the anodes of N parallel antifuse elements $AF_1, AF_2 \ldots AF_N$, as illustrated in FIG. 1, all the antifuse elements do not break down exactly at the same time. If antifuse elements are observed between the beginning and the end of a collective breakdown process, it appears that the number of broken down antifuse elements progressively increases until all are broken down. Thus, when the number of antifuse elements to be broken down is considerable, the current delivered by the voltage source tends to be distributed into the antifuse elements which are already broken down, to the detriment of those which are not yet broken down. When the number of elements to be broken down is high, the last antifuse elements take a longer time to break down because the source of voltage is weakened by the current delivered in the already broken down antifuse elements.

The present invention is based on the relatively straightforward idea, but nevertheless inventive, to limit the number of elements to be simultaneously broken down by subdividing a group of N antifuse elements to be broken down into N/P groups of P antifuse elements, and by performing N/P breakdown cycles of P antifuse elements. Designating by t(P) the collective breakdown time of P antifuse elements, and by TP the total duration of the breakdown according to the method of the invention, it can be written:

$$TP=t(P)+t(P)+ \ldots +t(P)=(N/P)*t(P)<t(N) \tag{1}$$

N/P is the number of breakdown cycles to be provided for obtaining the breakdown of the N antifuse elements, and t(N) is the collective breakdown time of the N antifuse elements (breakdown time according to the prior art).

The number P is preferably chosen so that the total breakdown time TP is optimal. Thus, designating by t(P+1) the collective breakdown time of P+1 antifuse elements, and by t(P−1) the collective breakdown time of P−1 antifuse elements, P is chosen so that:

$$TP=(N/P)*t(P)<(N/(P-1))*t(P-1) \tag{1}$$

and that $$TP=(N/P)*t(P)<(N/(P+1))*t(P+1) \tag{3}$$

The choice of a number P will now be discussed. In the current state of technology, it has been observed that the optimal number P is equal to 1. Indeed, the breakdown time of an isolated antifuse element is statistically shorter than half of the breakdown time of two antifuse elements, and is of course much shorter than the breakdown time of N antifuse elements divided by N. In addition to the limitations of the voltage/current source, this is also due to limitations regarding the size of the switches and the size of the conductive tracks used for distributing the high voltage, which must stand the sum of all the breakdown currents.

Thus, in the following, examples of implementation of the invention will be described choosing P=1. The optimal number P is, however, dependent on various technological parameters, such as the fan-out of the booster circuit delivering the breakdown voltage Vhv (its aptitude to deliver current), etc. This choice constitutes a non-limiting example only.

By way of a numerical example, the breakdown time of an oxide antifuse element is 0.5 ms, while the breakdown time of 20 antifuse elements is 50 ms. We have thus in this case:

$$TP=N/1*t(P=1)=20/1*0.5\ ms=10\ ms \quad (4)$$

$$t(N=20)=50\ ms \quad (5)$$

That is, a breakdown time of 10 ms comprises twenty breakdown cycles of 0.5 ms each, instead of a time of 50 ms for the collective breakdown of 20 antifuse elements.

A second aspect of the method according to the invention will now be discussed. An obstacle to the implementation of the first aspect of the invention includes determining the breakdown time t(P) to be applied to each of the groups of P antifuse elements. Although an experimental determination of t(P) is conceivable, technology variations between series of integrated circuits tend to render this time insufficient. Conversely, the choice of a very long time t(P) as a precautionary measure could make loose all or a part of the advantages of the method of the invention.

Thus, according to a second aspect of the invention, it is provided that the breakdown time of a group of P antifuse elements is determined in real time by detecting the breakdown of each antifuse element. According to the invention, the detection of the breakdown of each antifuse element is obtained by observing the voltage present on the cathode of the antifuse element, while this one receives a voltage Vhv on its anode. As long as the cathode voltage is floating, the antifuse element is electrically insulating and is not broken down.

When breakdown begins, the antifuse element becomes conductive although still highly resistive and the cathode voltage begins to rise. Breakdown is considered as being detected when the cathode voltage has reached a predetermined value Vref, which corresponds to a certain electrical resistance value of the antifuse element. In order that this cathode voltage can validly be used for the purposes of the present invention, a resistive and/or capacitive element must preferably be provided on the cathode, in order to form a voltage divider bridge with the antifuse element. As this will be apparent later, this resistive and/or capacitive element is generally present as the sole result of the presence of selection transistors coupling the cathodes of the antifuse elements to ground.

Figure 3:
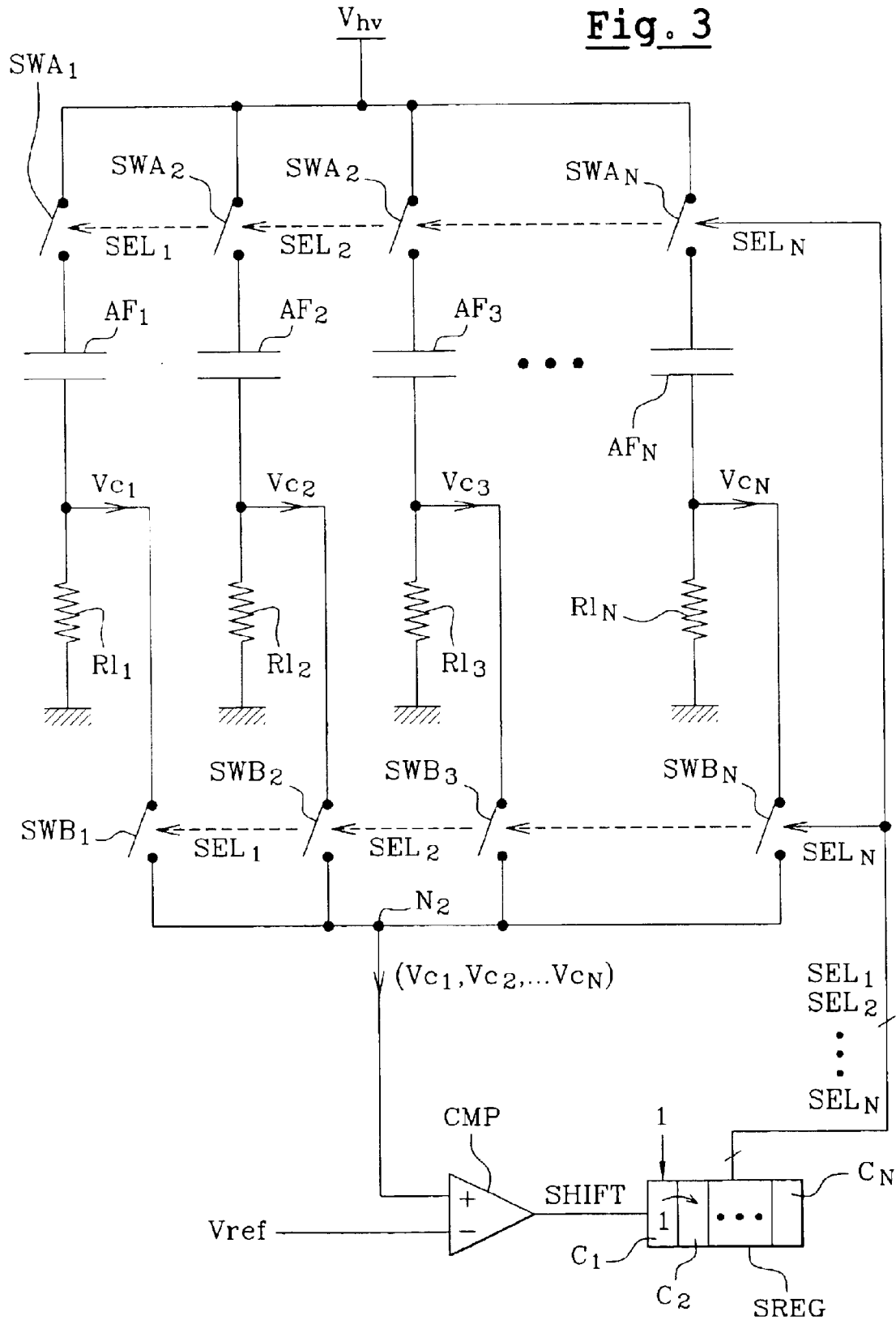
FIG. 3 illustrates the method of breaking down antifuse elements according to the present invention.

An example of implementing the method according to the invention will now be discussed. FIG. 3 shows an example of a joint implementation of the two aspects of the method of the invention, in the case of P=1. The N antifuse elements $AF_1$ to $AF_N$ of FIG. 1 can be seen, the anodes of which are coupled to node N1 receiving the breakdown voltage Vhv. According to the invention, the main switch SWg coupling node N1 to voltage Vhv is removed and replaced with N individual switches $SWA_1$, $SWA_2$, $SWA_3$. $SWA_N$ arranged each between the anode of an antifuse element and node N1.

The cathode of each antifuse element is coupled to ground by a resistance, respectively $Rl_1$, $Rl_2$, $Rl_3$ . . . $Rl_N$. This resistance generally corresponds to the drain-source resistance of a selection transistor of the antifuse element. This will become apparent later in the description of an example of an antifuse memory according to the invention.

Still according to the invention, the cathode of each antifuse element is also coupled to a node N2 by an individual switch, respectively $SWB_1$, $SWB_2$, $SWB_3$ . . . $SWB_N$. Node N2 is connected to the positive input of a comparator CMP, the negative input of which receives voltage Vref. The output of comparator CMP delivers a signal SHIFT which is applied to a shift control input of a shift register SREG comprising N cells arranged in cascade $C_1$, $C_2$ . . . $C_N$. The shift register comprises N outputs each corresponding to a cell, respectively delivering signals $SEL_1$, $SEL_2$, $SEL_3$, . . . $SEL_N$. Signal $SEL_1$ drives the switches $SWA_1$ and $SWB_1$, signal $SEL_2$ drives the switches $SWA_2$ and $SWB_2$, etc., signal $SEL_N$ drives the switches SWAN and $SWB_N$.

The breakdown process of the N antifuse elements takes place as follows. Register SREG is set to 0, the breakdown voltage Vhv is applied to node N1 and a bit at 1 is loaded into the first cell $C_1$ of register SREG. Signal $SEL_1$ passes to 1, the other signals $SEL_2$ . . . $SEL_N$ are at 0, so that the switches $SWA_1$, $SWB_1$ close. Voltage Vhv is present on the anode of the first antifuse element $AF_1$, the cathode of which is coupled to the positive input of comparator CMP. When element $AF_1$ begins to become conductive, a cathode voltage Vc1 appears. When cathode voltage Vc1 reaches threshold Vref, signal SHIFT at the output of the comparator passes to 1. The bit at 1 is shifted into the next cell $C_2$ while cell $C_1$ passes back to 0. Signal $SEL_2$ passes to 1, signal $SEL_1$ passes back to 0 and the other signals $SEL_3$ . . . $SEL_N$ remain at 0. The switches $SWA_1$, $SWB_1$ open and the switches $SWA_2$, $SWB_2$ close. Voltage Vhv is present on the anode of the second antifuse element $AF_2$ and the cathode of the antifuse element $AF_2$ is coupled to the positive input of comparator CMP. A cathode voltage Vc2 appears and causes a new shift of register SREG. The process continues like this until all the antifuse elements are broken down.

Thus, comparator CMP and the switches $SWB_1$ to $SWB_N$ allow the detection of the breakdown of each element, and the control of the passage to the next breakdown cycle. The time imparted to each breakdown cycle is thus locked to its minimal value, which can be different from one antifuse element to the other.

As noted above, threshold Vref corresponds to a certain electrical resistance value of the antifuse element. A resistance lower than 100 KΩ is considered as representative of a satisfactory breakdown. The fact that the broken down antifuse element forms a voltage divider bridge with the serial resistance $Rl_1$ to $Rl_N$ is taken into account for calculating threshold Vref. A voltage Vref representing 20% of voltage Vhv, that is, 2V for a voltage Vhv of 10V, can be chosen.

Figure 4:
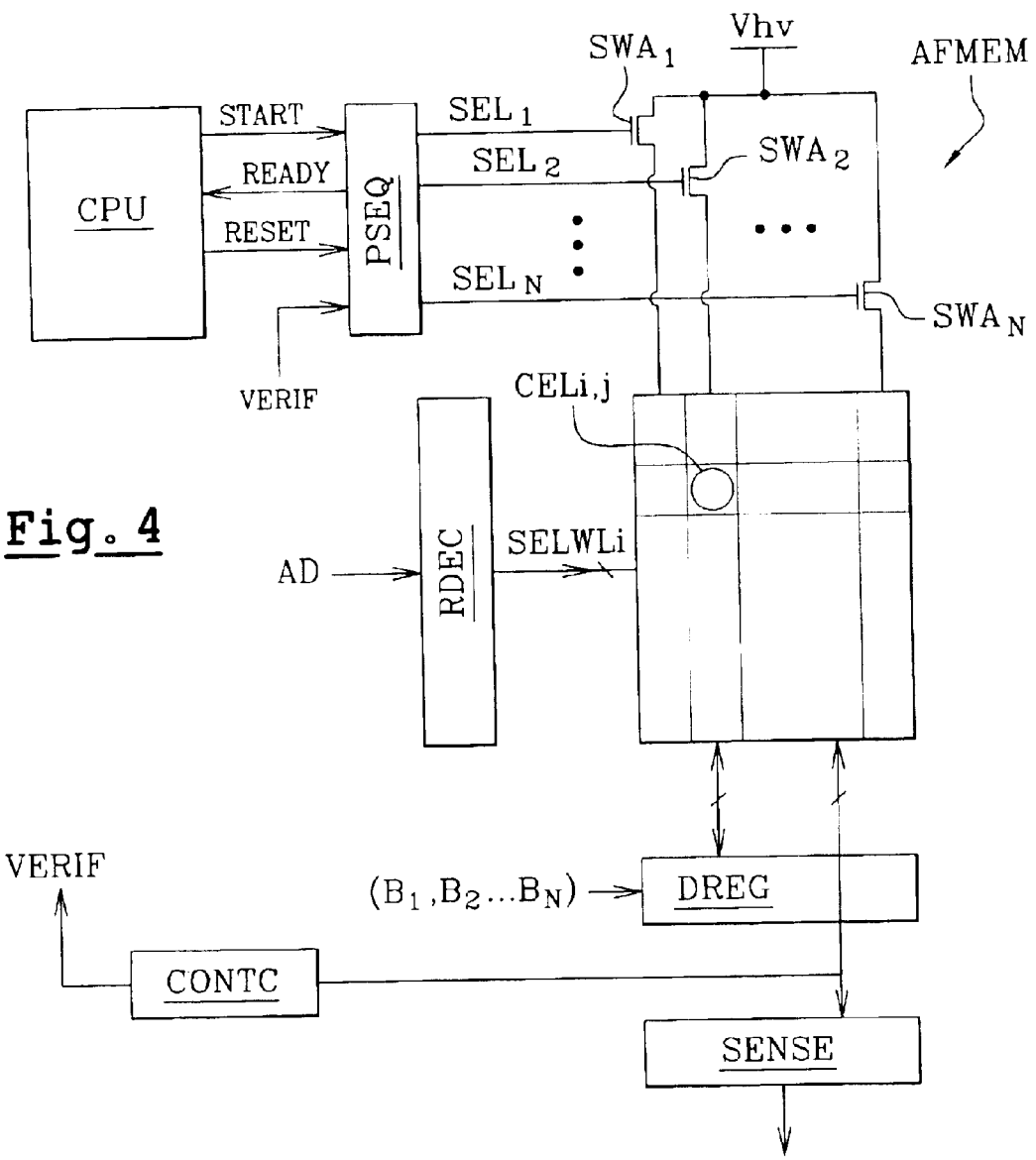
FIG. 4 is a block diagram of an antifuse memory according to the present invention.

An example of an antifuse memory according to the invention will now be discussed. FIG. 4 shows an example embodiment in CMOS technology of an antifuse memory AFMEM according to the invention. Memory AFMEM conventionally comprises a memory array MA comprising antifuse memory cells CELi,j, a line decoder RDEC receiving a line address AD as an input, a data register DREG, a read circuit SENSE and a central processing unit CPU. The memory AFMEM is implemented as an integrated circuit comprising a central processing unit CPU controlling the write and read operations of the memory. Thus, the CPU loads into register DREG data to be recorded in the memory array and reads, at the output of circuit SENSE, data read in the memory array.

According to the invention, the memory comprises the above described switches $SWA_1$ to $SWA_N$, a wired logic programming sequential circuit PSEQ for driving the switches SWA, and a control circuit CONTC for controlling the breakdown process of antifuse elements and delivering a signal VERIF applied to sequential circuit PSEQ. The switches $SWA_1$ to $SWA_N$ are MOS transistors coupled by their drain to node N1 which receives voltage Vhv. The sequential circuit delivers the above described selection signals SEL$_1$, SEL$_2$ ... SEL$_N$, in such a way that transistors SWA$_1$ to SWAN are turned on one after the other.

Figure 5:
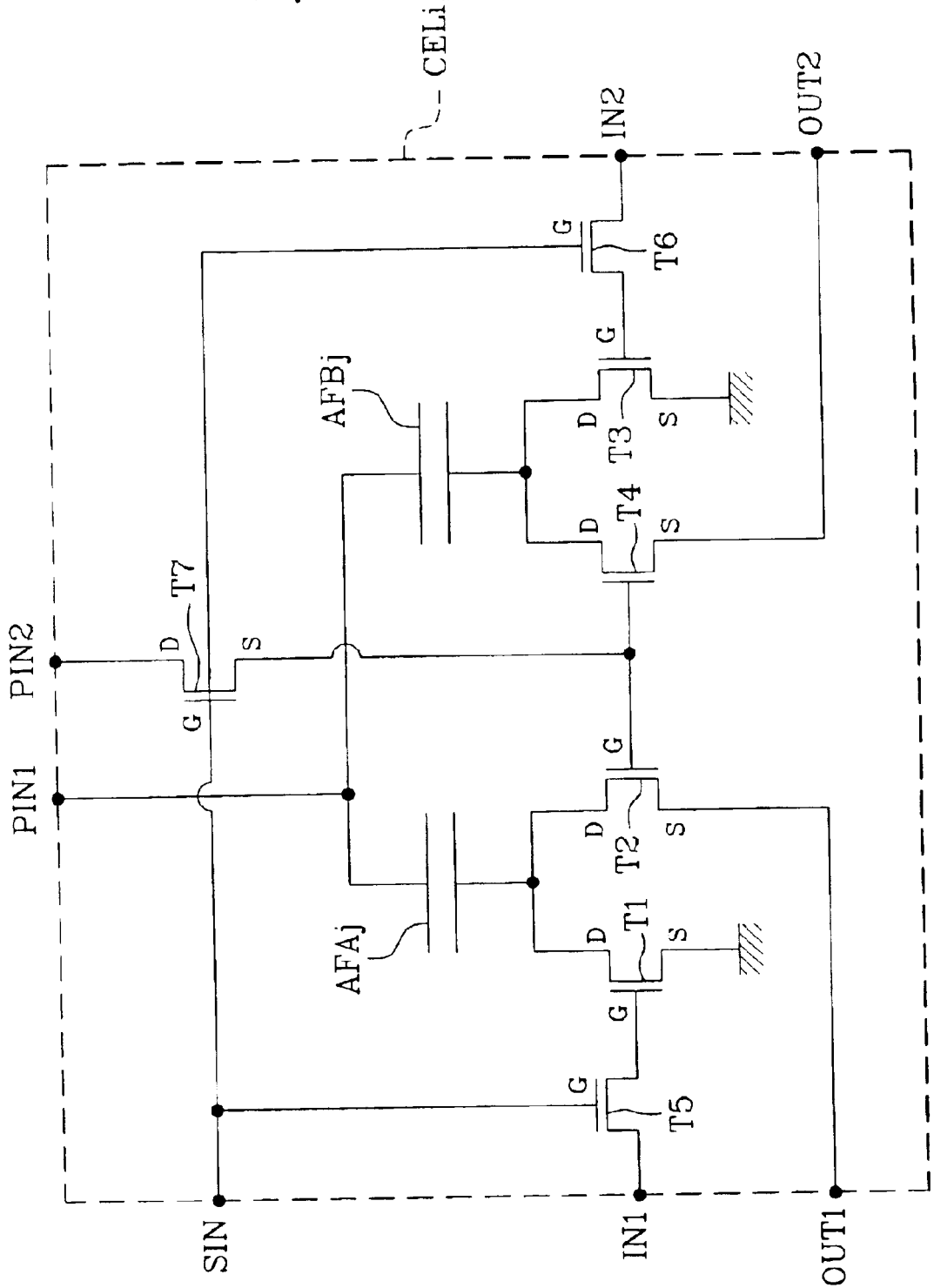
FIG. 5 is an electrical diagram of the antifuse memory cell of the memory of FIG. 4.

An architecture of the memory cells will now be discussed. FIG. 5 shows the architecture of an antifuse memory cell CELi,j, which is a differential architecture common to all the cells of the memory array. The memory cell comprises two antifuse elements AFAj, AFBj. The anodes of the elements AFAj, AFBj are coupled to an input PIN1 of the cell. The cathode of element AFAj is coupled to the drain of a transistor T1 the source of which is connected to ground, and to the drain of a transistor T2 the source of which is connected to an output OUT1 of the cell. In a similar way, the cathode of element AFBj is coupled to the drain of a transistor T3 the source of which is connected to ground, and to the drain of a transistor T4 the source of which is connected to an output OUT2 of the cell. The gate of transistor T1 is coupled to an input IN1 of the cell by a transistor T5. The gate of transistor T3 is coupled to an input IN2 of the cell by a transistor T6. The gates of the transistors T5, T6 are connected to an input SIN of the cell. The gates of the transistors T2, T4 are coupled to an input PIN2 of the cell by a transistor T7 the gate of which is connected to input SIN.

The selection of a memory cell for writing or reading is performed by applying a selection signal at 1 (supply voltage Vcc of the integrated circuit) to the input SIN of the cell, rendering transistors T5, T6, T7 conductive.

Programming of a memory cell will now be discussed. The writing of a bit Bi in a memory cell is performed by applying bit Bi to input IN1 and the inverse bit /Bi to input IN2. The breakdown voltage Vhv is applied to input PIN1 and causes the breakdown of element AFAj or element AFBj depending on whether bit Bi is at 1 (transistor T1 conductive) or at 0 (bit /Bi at 1, transistor T3 conductive). According to the invention, the breakdown of element AFAj or AFBj is detected by monitoring its cathode voltage, using transistor T2 or T4 and the output OUT1 or OUT2 of the cell. Thus, the pair of transistors T2, T4 is used during the programming process as one of the switches SWB (SWB$_1$ to SWB$_N$), as described above (FIG. 3).

The reading of a memory cell will now be discussed. The reading of a bit in the memory cell is performed by applying a voltage Vread to its inputs PIN1 and PIN2, and by observing the outputs OUT1 and OUT2. If the output OUT1 is at 1 (voltage Vread) and the output OUT2 at 0, this means that the data loaded in the memory cell is the logic 1 (element AFAj is broken down). If the output OUT1 is at 0 and the output OUT2 at 1, this means that the data loaded in the memory cell is the logic 0 (element AFBj is broken down).

Figure 6:
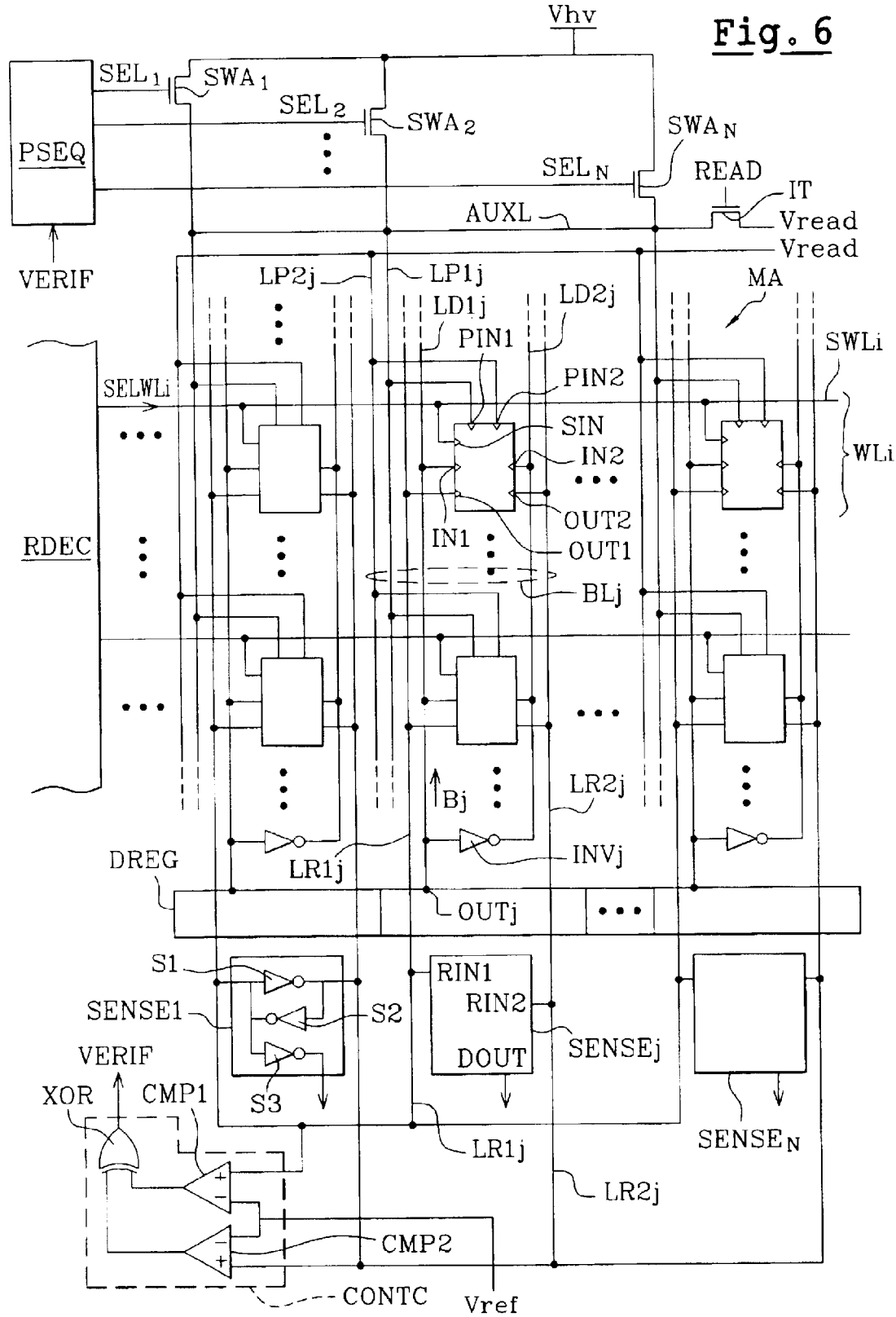
FIG. 6 is a more detailed diagram of a memory array and some other elements of the memory of FIG. 4.

The architecture of the memory array will now be discussed. FIG. 6 shows with more details the architecture of the memory array MA, as well as the architectures of circuit CONTC and circuit SENSE.

Circuit SENSE comprises sense amplifiers SENSE1, SENSE2 ... SENSE$_N$ comprising each two inputs RIN1, RIN2 and an output DOUT (see SENSEj on the figure). Each sense amplifier comprises, for example, three inverting gates S1, S2, S3 (see SENSE1 on the figure). The gates S1, S2 are connected head to tail. The input of gate S1 is connected to input RIN1 and the input of gate S2 connected to input RIN2. Gate S3 has its input connected to the output of one of the gates S1, S2 and its output forms the output DOUT of the sense amplifier.

Circuit CONTC comprises two comparators CMP1, CMP2 receiving voltage Vref on their negative inputs. The outputs of the comparators are applied to the input of an EXCLUSIVE OR-gate XOR, the output of which delivers signal VERIF.

In memory array MA, the differential antifuse memory cells CELi,j are arranged in N-bit lines BLj (BL1, BL2, ... BLN) and K word lines WLi, forming rows of N memory cells each, with a row corresponding to a word line.

Each word line WLi comprises a selection line SWLi connected to the inputs SIN of the memory cells of the word line. The line SWLi receives a selection signal SELWLi delivered by decoder RDEC, which is at 1 when the received address corresponds to the considered word line.

Each bit line BLj comprises the following. A first voltage distribution line LP1j is connected to the inputs PIN1 of the cells of the bit line. A second voltage distribution line LP2j is connected to the inputs PIN2 of the cells of the bit line. A data line LD1j couples an output OUTj of register DREG to the inputs IN2 of the cells of the bit line. A data line LD2j couples by an inverting gate INVj the output OUTj of register DREG to the inputs IN2 of the cells of the bit line. A read line LR1j couples the outputs OUT1 of the cells of the bit line to the input RIN1 of a sense amplifier SENSEj. A read line LR2j couples the outputs OUT1 of the cells of the bit line to an input RIN2 of sense amplifier SENSEj.

According to the invention, each read line LR1j is connected to the positive input of comparator CMP1, and each read line LR2j is connected to the positive input of comparator CMP2. Each distribution line LP1j is connected to node N1 by a transistor SWAj of corresponding rank j (SWA$_1$, SWA$_2$, ... SWA$_N$). The lines LP1j are also connected to an auxiliary common line AUXL, allowing voltage Vread to be applied to lines LP1j during read phases. Voltage Vread is applied to line AUXL by an insulating transistor IT driven by a signal READ.

The selection of a row of memory cells for reading or writing is performed by applying an address AD to decoder RDEC. This one then delivers a selection signal SELWLi equal to 1 (supply voltage Vcc of the integrated circuit) on the line SWLi designated by address AD. Signal SELWLi is present on input SIN of the cells of the word line, rendering the transistors T5, T6, T7 conductive in each of the cells.

The reading of a row of cells will now be discussed. The reading of memory cells is performed by applying voltage Vread to lines LP1j (via line AUXL) and lines LP2j, and by selecting a word line to be read by decoder RDEC. The selected cells each have an output OUT1 or OUT2 which passes to 1, and each of the sense amplifiers SENSE1 to SENSEN delivers data.

The writing of a row of cells will now be discussed. The writing of data in a word line WLi selected by decoder RDEC is obtained by programming each of the cells of the word line. The programming of each cell corresponds to the breakdown of an antifuse element AFA or AFB. The data is first recorded in register DREG. This data takes the form of a series of bits B1, B2, ... B$_N$. Each bit Bj is applied to a line LD1j and each inverse bit /Bj is applied to a line LD2j. Voltage Vhv is applied to node N1. According to the invention, voltage Vread is also applied to lines LP2j in order that the transistors T2, T4 of the selected cells (FIG. 5) are conductive and the outputs OUT1, OUT2 deliver an anode voltage allowing comparators CMP1, CMP2 to control the breakdown process. It goes without saying that any other voltage allowing the turning on of transistors T2, T4 could be used.

The CPU applies a signal START to sequential circuit PSEQ, which then sets signal SEL$_1$ to 1, all the other signals SEL$_2$ to SEL$_N$ remain at 0. Only transistor SWA$_1$ is conductive and only the first cell of the row to be programmed receives voltage Vhv. One of the two antifuse elements AFAj, AFBj receives voltage Vhv, depending on the value of the data present on the inputs IN1, IN2 (bits B1 and /B1). When the element AFAj or AFBj is broken down, the cathode voltage present on the positive input of one of the comparators CMP1, CMP2 lets switch the output of one comparator to 1 while the output of the other comparator remains at 0. Signal VERIF passes to 1, which triggers the programming cycle of the next cell. Sequential circuit PSEQ then sets to 1 signal $SEL_2$ and resets signal $SEL_1$, all the other signals $SEL_3$ to $SEL_N$ remain at 0. Transistor $SWA_2$ becomes conductive and the second cell of the row to be programmed receives voltage Vhv. When an antifuse element of the second cell is broken down, signal VERIF passes back to 1 and triggers the programming cycle of the next cell, and so on until the N cells are programmed. When the last cell is programmed, the sequential circuit sends a signal READY.

Figure 7:
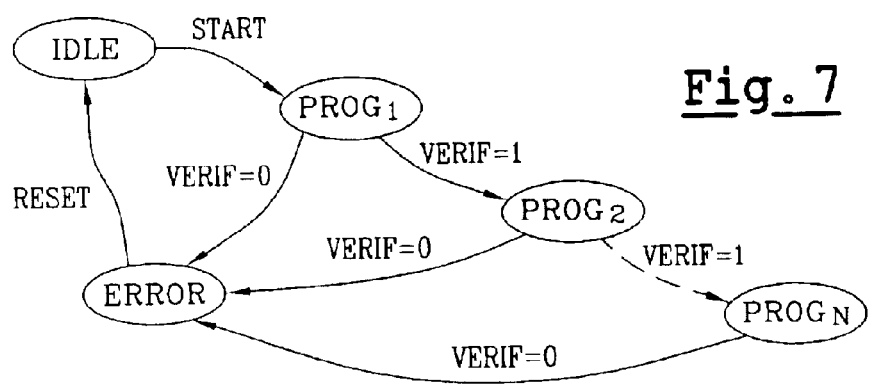
FIG. 7 is a state diagram of a programming sequential circuit for the antifuse memory illustrated in FIG. 4.

Sequential circuit PSEQ is, for example, realized from the state diagram represented in FIG. 7. The sequential circuit has an idle state IDLE and passes to a state $PROG_1$ (programming of the first cell) on reception of signal START. The sequential circuit passes to a state $PROG_2$ (programming of the second cell) on reception of signal VERIF at 1, then passes to a state $PROG_3$ on reception of signal VERIF at 1, and so on up to a state $PROG_N$. The sequential circuit in state $PROG_N$ returns to state IDLE emitting signal READY when signal VERIF passes to 1. A delay can be provided on the assumption that a cell could not manage to be programmed (antifuse element never reaching the breakdown state). In this case, if signal VERIF remains at 0 some time after the switching into one of the states $PROG_1$, $PROG_2$ ... $PROG_N$, the sequential circuit passes to a state ERROR in which it does not emit signal READY, and can be only reset in the state IDLE by the application of a signal RESET.

The programming sequential circuit is of course likely to have various other alternative embodiments and can also be in the form of a shift register, as above described, signal VERIF is then used as shift signal (SHIFT).

It will be clearly apparent to those skilled in the art that the method according to the invention is likely to have various alternatives. Sequential circuit PSEQ could, for example, drive the transistors $SWA_1$ to $SWA_N$ by pairs for the simultaneous programming of two memory cells (P=2), or drive them by groups of three (P=3) or more. On the other hand, the number P of antifuse elements in each group of simultaneously broken down antifuse elements may not be constant during the programming of a row of memory cells. Thus, if the ratio N/P is not a whole number, the last group of simultaneously programmed cells may be equal to the remainder of the division of N by P. For example, if a row of cells comprises 10 cells and the programming is performed by groups of three, there can be provided three simultaneous programming cycles of three cells followed with a programming cycle of one cell.

It should be noted that an individual programming (P=1) requires only two comparators CMP1, CMP2. If a programming by pairs is provided, two circuits CONTC each comprising two comparators CMP1, CMP2 will have to be provided for simultaneously controlling the breakdown of the antifuse elements in the two cells, and so on depending on the number P of simultaneously programmed cells.

Thus, another advantage of having P=1 is that a single detection means can be used for detecting the breakdown of all the antifuse elements. These are broken down one after the other. Thus, also if 1 is not the optimal value of P in terms of global programming time, this value can be chosen for the simplification of the detection means. It is then a matter of compromise between the total breakdown time and the simplicity of implementation of the second aspect of the method.

On the other hand, although it has been proposed in the foregoing to use read transistors T2, T4 and the outputs OUT1, OUT2 of the cells for monitoring the cathode voltage during the breakdown process, specific transistors and specific outputs could be provided in the cells to that effect.

Also, although it has been proposed in the foregoing to apply voltage Vread to the gates of transistors T2, T4 during the breakdown process for rendering these ones conductive and monitoring the cathode voltage of the antifuse elements from the outputs OUT1 and OUT2, another control voltage could be applied to them, for example, voltage Vhv.

On the other hand, the present invention is applicable to various architectures of antifuse memories. Although the above described memory comprises one column of N bit lines only, an antifuse memory according to the invention may also comprise several columns of N bit lines each.

Various other means may also be provided for monitoring the cathode voltage, for example, logic gates having predetermined switching thresholds, differential amplifiers, etc.

An example of obtained results will now be discussed. Let's assume that the memory comprises 10 word lines of 20 bits each (that is 20 bit lines, N=20), that the collective breakdown time of 20 antifuse elements is 50 ms and that the individual breakdown time of an antifuse element is 0.5 ms, as indicated above.

In this case, the selection time of the memory cells is negligible compared to the programming time. The time necessary for breaking down 200 antifuse elements is on the order of 200*0.5, that is, 100 ms with the method of the invention. This breakdown time is on the order of 50 ms*10, that is, 500 ms with the method of the prior art. The gain in terms of programming time is thus 400 ms for the breakdown of 200 antifuse elements.

That which is claimed is:

1. A method of programming a row of parallel memory cells, each memory cell comprising at least one antifuse element, the method comprising:
    breaking down at least N antifuse elements in the row of parallel memory cells by applying a breakdown voltage to an anode of each antifuse element;
    the N antifuse elements being sequentially broken down in groups of P antifuse elements, with P being less than N and at least equal to 1, the P antifuse elements of a same group simultaneously receiving the breakdown voltage, and the breakdown of a next group of P antifuse elements immediately taking place after the breakdown of a previous group of P antifuse elements.

2. A method according to claim 1, wherein the number P is equal to 1; and wherein the breakdown voltage is sequentially applied to the antifuse elements in each group so that the antifuse elements are broken down one after another.

3. A method according to claim 1, wherein the number P is chosen from among several possible values so that a total breakdown time of the row of N antifuse elements is reduced.

4. A method according to claim 1, wherein the number P of antifuse elements in each group is not constant during programming of the row of memory cells.

5. A method according to claim 1, further comprising detecting the breakdown of the antifuse elements.

6. A method according to claim 5, wherein the breakdown voltage is not applied to a next group of P antifuse elements if the breakdown of a previous group of antifuse elements has not been detected.

7. A method according to claim 5, wherein the breakdown of an antifuse element is detected when a voltage greater than a threshold appears on a cathode of the antifuse element while its anode receives the breakdown voltage.

8. A method according to claim 1, wherein the row of parallel memory cells comprises a plurality of rows of parallel memory cells, the memory cells being arranged in rows and columns; and further comprising word lines connected to the rows of the memory cells; and bit lines connected to the columns of the memory cells, each bit line comprising a distribution line for distributing the breakdown voltage to the memory cells within a respective row of memory cells; the method further comprising:
selecting a word line and sequentially applying the breakdown voltage to a respective distribution line so that a group of P bit lines corresponding to the respective row of memory cells simultaneously receive the breakdown voltage.

9. A method according to claim 1, wherein each memory cell has a differential architecture and comprises a pair of antifuse elements; and a pair of switches for selecting one antifuse element from the pair of antifuse elements based upon binary data.

10. An antifuse integrated circuit memory comprising:
at least one row of parallel memory cells, each memory cell comprising at least one antifuse element and being programmable by breaking down said at least one antifuse element; and
program means for programming said at least one row of parallel memory cells by applying a breakdown voltage to an anode of each antifuse element;
said program means comprising means for sequentially applying the breakdown voltage to groups of P antifuse elements, with P being less than N and at least equal to 1, said antifuse elements of a same group simultaneously receiving the breakdown voltage, and the breakdown of a next group of antifuse elements immediately taking place after the breakdown of a previous group of antifuse elements.

11. A memory according to claim 10, wherein P is equal to 1; and wherein said program means sequentially applies the breakdown voltage to said antifuse elements in each group so that said antifuse elements are broken down one after another.

12. A memory according to claim 10, wherein the number P of antifuse elements in each group is not constant during programming of said at least one row of memory cells.

13. A memory according to claim 10, further comprising detection means for detecting the breakdown of said antifuse elements, and for delivering a breakdown detection signal in response thereto.

14. A memory according to claim 13, wherein said program means does not apply a breakdown voltage to a next group of antifuse elements if the breakdown of a previous group of antifuse elements has not been detected.

15. A memory according to claim 13, wherein said detection means comprises at least one comparator having a first input coupled to a cathode of at least one antifuse element, a second input for receiving a reference voltage, and an output for delivering the breakdown detection signal.

16. A memory according to claim 13, wherein program means comprises:
a sequential circuit receiving the breakdown detection signal; and
a plurality of switches driven by said sequential circuit for sequentially applying the breakdown voltage to said antifuse elements.

17. A memory according to claim 10, wherein said at least one row of parallel memory cells comprises a plurality of rows of parallel memory cells, said memory cells being arranged in rows and columns; and further comprising:
word lines connected to the rows of said memory cells; and
bit lines connected to the columns of said memory cells, each bit line comprising a distribution line for distributing the breakdown voltage to said memory cells within a respective row of memory cells;
said program means selecting a word line and sequentially applying the breakdown voltage to a respective distribution line so that a group of P bit lines corresponding to the respective row of memory cells simultaneously receive the breakdown voltage.

18. A memory according to claim 10, wherein each memory cell has a differential architecture and comprises:
a pair of antifuse elements; and
a pair of switches for selecting one antifuse element of said pair of antifuse elements based upon binary data.

19. A memory comprising:
an array of memory cells arranged in rows and columns, each memory cell comprising at least one antifuse element and being programmable by breaking down said at least one antifuse element;
program circuitry for programming at least one row of memory cells by applying a breakdown voltage to an anode of each antifuse element in the at least one row;
said program circuitry sequentially applying the breakdown voltage to groups of P antifuse elements, with P being less than N and at least equal to 1, said antifuse elements of a same group simultaneously receiving the breakdown voltage; and
detection circuitry for detecting the breakdown of said antifuse elements, and the breakdown of a next group of antifuse elements immediately taking place after the breakdown of a previous group of antifuse elements.

20. A memory according to claim 19, wherein P is equal to 1; and wherein said program circuitry sequentially applies the breakdown voltage to said antifuse elements in each group so that said antifuse elements are broken down one after another.

21. A memory according to claim 19, wherein the number P of antifuse elements in each group is not constant during programming of said at least one row of memory cells.

22. A memory according to claim 19, wherein said program circuitry does not apply a breakdown voltage to a next group of antifuse elements if the breakdown of a previous group of antifuse elements has not been detected.

23. A memory according to claim 19, wherein said detection circuitry comprises at least one comparator having a first input coupled to a cathode of at least one antifuse element, a second input for receiving a reference voltage, and an output for delivering a breakdown detection signal.

24. A memory according to claim 19, wherein said detection circuitry delivers a breakdown detection signal in response to detecting the breakdown of said antifuse elements; and wherein said program circuitry comprises:
a sequential circuit receiving the breakdown detection signal; and
a plurality of switches driven by said sequential circuit for sequentially applying the breakdown voltage to said antifuse elements.

25. A memory according to claim 19, wherein said at least one row of parallel memory cells comprises a plurality of rows of parallel memory cells, said memory cells being arranged in rows and columns; and further comprising:

word lines connected to the rows of said memory cells; and bit lines connected to the columns of said memory cells, each bit line comprising a distribution line for distributing the breakdown voltage to said memory cells within a respective row of memory cells;

said program circuitry selecting a word line and sequentially applying the breakdown voltage to a respective distribution line so that a group of P bit lines corresponding to the respective row of memory cells simultaneously receive the breakdown voltage.

26. A memory according to claim 19, wherein each memory cell has a differential architecture and comprises:

a pair of antifuse elements; and a pair of switches for selecting one antifuse element of said pair of antifuse elements based upon binary data.

\* \* \* \* \*